United States Patent
Maixner

(10) Patent No.: US 11,754,600 B1
(45) Date of Patent: Sep. 12, 2023

(54) METHOD FOR DETERMINING AN ELECTRIC CURRENT WITH A SHUNT ARRANGEMENT, WITH COMPENSATION OF HEATING IN THE SHUNT ARRANGEMENT GENERATED BY THE CURRENT

(71) Applicant: Bruker BioSpin GmbH, Ettlingen (DE)

(72) Inventor: Michael Maixner, Bietigheim (DE)

(73) Assignee: BRUKER BIOSPIN GMBH, Ettlingen (DE)

( * ) Notice: Subject to any disclaimer, the term of this patent is extended or adjusted under 35 U.S.C. 154(b) by 0 days.

(21) Appl. No.: 18/173,102

(22) Filed: Feb. 23, 2023

(30) Foreign Application Priority Data

Feb. 25, 2022 (DE) ...................... 10 2022 201 996.2

(51) Int. Cl.
| | |
|---|---|
| G01R 19/32 | (2006.01) |
| G01R 19/25 | (2006.01) |
| G01R 15/04 | (2006.01) |
| G01R 1/20 | (2006.01) |

(52) U.S. Cl.
CPC .............. G01R 19/32 (2013.01); G01R 1/203 (2013.01); G01R 15/04 (2013.01); G01R 19/2509 (2013.01)

(58) Field of Classification Search
CPC ........ G01R 19/32; G01R 1/203; G01R 15/04; G01R 19/2509
USPC ........................................................ 324/105
See application file for complete search history.

(56) References Cited

U.S. PATENT DOCUMENTS

| | | | |
|---|---|---|---|
| 2017/0059632 A1* | 3/2017 | Parkman ................ | G01R 19/32 |
| 2022/0057438 A1* | 2/2022 | Gruendler .............. | G01R 1/203 |

FOREIGN PATENT DOCUMENTS

| | | | | |
|---|---|---|---|---|
| CN | 104049130 B | * | 7/2017 | ............. G01R 1/203 |
| DE | 102004062655 A1 | | 7/2006 | |
| DE | 102013221210 A1 | | 4/2015 | |
| JP | 2000055945 A | | 2/2000 | |
| JP | 2014529075 A | * | 10/2014 | ......... G01R 19/2506 |
| WO | WO-2004021021 A2 | * | 3/2004 | ........... G01R 15/146 |

* cited by examiner

*Primary Examiner* — Tung X Nguyen
*Assistant Examiner* — Robert P Alejnikov, Jr.
(74) *Attorney, Agent, or Firm* — LEYDIG, VOIT & MAYER, LTD.

(57) ABSTRACT

A method for determining an electric current includes sending the electric current to be measured through a shunt arrangement that includes at least three identical resistors. The at least three identical resistors are thermally coupled to a common base plate and are electrically interconnected such that the electric current is at least partially divided such that a first local current through a first resistor is not equal to a second local current through a second resistor. The method also includes measuring, at the shunt arrangement, a first voltage and a second voltage via which the voltage dropping across a first resistor and across a second resistor are directly or indirectly determinable, and determining the electric current via the first voltage and the second voltage. A heating in the shunt arrangement generated by the electric current is at least partially taken into account in the determining the electric current.

17 Claims, 4 Drawing Sheets

| A | B | C | D | E | F | G | H | I | J | K | L |
|---|---|---|---|---|---|---|---|---|---|---|---|
| Ui | Ux | Error % | Us | Us approx. | Ui mess | Error % | Ui mess altern | Error % | Corr fact Ui mess altern mod | 0.9 Error % | Calc. No. |
| 1 | 1 | 0 | 1.5 | 1.5 | 1 | 0.0 | 1 | 0.0 | 1 | 0.0 | CN1 |
| 1 | 1.1 | -10 | 1.611627907 | 1.6125 | 0.997674419 | 0.2 | 1.00620155 | -0.6 | 1.013023256 | -1.3 | CN2 |
| 1 | 1.2 | -20 | 1.721173913 | 1.725 | 0.991304348 | 0.9 | 1.008695652 | -0.9 | 1.022608696 | -2.3 | CN3 |
| 1 | 1.3 | -30 | 1.830612245 | 1.8375 | 0.981632653 | 1.8 | 1.008163265 | -0.8 | 1.029387755 | -2.9 | CN4 |
| 1 | 1.4 | -40 | 1.938461538 | 1.95 | 0.969230769 | 3.1 | 1.005128205 | -0.5 | 1.033846154 | -3.4 | CN5 |
| 1 | 1.5 | -50 | 2.045454545 | 2.0625 | 0.954545455 | 4.5 | 1 | 0.0 | 1.036363636 | -3.6 | CN6 |
| 1 | 1.6 | -60 | 2.151724138 | 2.175 | 0.937931034 | 6.2 | 0.993103448 | 0.7 | 1.037241379 | -3.7 | CN7 |
| 1 | 1.7 | -70 | 2.257377049 | 2.2875 | 0.919672131 | 8.0 | 0.984699454 | 1.5 | 1.036721311 | -3.7 | CN8 |
| 1 | 1.8 | -80 | 2.3625 | 2.4 | 0.9 | 10.0 | 0.975 | 2.5 | 1.035 | -3.5 | CN9 |
| 1 | 1.9 | -90 | 2.467164179 | 2.5125 | 0.879104478 | 12.1 | 0.964179104 | 3.6 | 1.032238806 | -3.2 | CN10 |
| 1 | 2 | -100 | 2.571428571 | 2.625 | 0.857142857 | 14.3 | 0.952380952 | 4.8 | 1.028571429 | -2.9 | CN11 |
| 1 | 2.1 | -110 | 2.675342466 | 2.7375 | 0.834246575 | 16.6 | 0.939726027 | 6.0 | 1.024109589 | -2.4 | CN12 |
| 1 | 2.2 | -120 | 2.778947368 | 2.85 | 0.810526316 | 18.9 | 0.926315789 | 7.4 | 1.018947368 | -1.9 | CN13 |
| 1 | 2.3 | -130 | 2.882278481 | 2.9625 | 0.786075949 | 21.4 | 0.912236287 | 8.8 | 1.013164557 | -1.3 | CN14 |
| 1 | 2.4 | -140 | 2.985365854 | 3.075 | 0.76097561 | 23.9 | 0.897560976 | 10.2 | 1.006829268 | -0.7 | CN15 |
| 1 | 2.5 | -150 | 3.088235294 | 3.1875 | 0.735294118 | 26.5 | 0.882352941 | 11.8 | 1 | 0.0 | CN16 |
| 1 | 2.6 | -160 | 3.190909091 | 3.3 | 0.709090909 | 29.1 | 0.866666667 | 13.3 | 0.992727273 | 0.7 | CN17 |
| 1 | 2.7 | -170 | 3.293406593 | 3.4125 | 0.682417582 | 31.8 | 0.850549451 | 14.9 | 0.985054945 | 1.5 | CN18 |
| 1 | 2.8 | -180 | 3.395744681 | 3.525 | 0.655319149 | 34.5 | 0.834042553 | 16.6 | 0.977021277 | 2.3 | CN19 |
| 1 | 2.9 | -190 | 3.497938144 | 3.6375 | 0.627835052 | 37.2 | 0.817182131 | 18.3 | 0.968659794 | 3.1 | CN20 |
| 1 | 3 | -200 | 3.6 | 3.75 | 0.6 | 40.0 | 0.8 | 20.0 | 0.96 | 4.0 | CN21 |
| | | (A-B)*100 | (3*B*B+3*B)/(3*B+1) | 3*(A+3*B)/8 | 8*D/3-3*B | (A-F)*100 | D*2/3+(D*2/3-B)*8/3 | (A-H)*100 | D*2/3+(KF)*(D*2/3-B)*8/3 | (A-J)*100 | |

Fig. 2

METHOD FOR DETERMINING AN ELECTRIC CURRENT WITH A SHUNT ARRANGEMENT, WITH COMPENSATION OF HEATING IN THE SHUNT ARRANGEMENT GENERATED BY THE CURRENT

CROSS REFERENCE TO RELATED APPLICATIONS

This application claims benefit to German Patent Application No. DE 10 2022 201 996.2, filed on Feb. 25, 2022, which is hereby incorporated by reference herein.

FIELD

The present disclosure relates to a method for determining an electric current Is, wherein the electric current Is to be measured is sent through a shunt arrangement, a voltage is measured at the shunt arrangement, and the electric current Is is determined by means of the measured voltage, wherein a heating in the shunt arrangement generated by the electric current Is is at least partially taken into account in the determination of the electric current Is.

BACKGROUND

In many technical applications, for example, during the operation of nuclear magnetic resonance (NMR) instruments, a precise measurement of electric currents is of great significance, for example, in order to be able to precisely control measurement conditions, such as gradient currents in the NMR instrument. Electric currents are usually measured by sending the current to be measured across a low-resistance (in comparison to the operated consumer) resistor (also referred to as a measuring resistor or a shunt), which is connected in series with the operated consumer. By measuring the voltage drop U across the measuring resistor having a resistance value R, the electric current I can be determined using Ohm's law (I=U/R). This requires that the resistance value R of the measuring resistor be known.

The current to be measured can significantly heat up the measuring resistor, which results in a change (increase) in the resistance value. If the heating of the measuring resistor remains unaccounted for, the current measurement becomes significantly corrupted as a result. The heating can be minimized by means of a measuring resistor having the lowest possible resistance; however, the voltage drop then also decreases and can be more difficult to detect compared to the noise. A significant heating of the measuring resistor usually cannot be ruled out in particular for the case in which the electric currents to be measured with the measuring resistor can greatly vary (by multiple orders of magnitude).

A method for measuring an electric current by means of a shunt, which is formed by a conductive volume, has been made known, for example, from US 2017/0059632 A1. A voltage drop across the shunt is supplied to a first amplifier, wherein the voltage drop includes a temperature drift error. A temperature sensor is arranged on the shunt. A second amplifier is connected to the output of the first amplifier. The second amplifier is connected to the temperature sensor having negative feedback, and so the temperature drift error is compensated for at the output of the second amplifier. This method requires a measurement of the temperature of the shunt and precise knowledge of the temperature dependence of the resistance value of the shunt.

DE 10 2004 062 655 A1 provides that, in the case of a current measurement carried out indirectly by measuring voltage at a shunt resistor, the resistance value is corrected on the basis of the current ambient temperature Tu and, in addition, a correction for a temperature increase is carried out, the temperature increase arising due to a power loss generated by the current flow in the shunt resistor. The self-heating correction is simulated with the pulse response of the shunt resistor system by convoluting a power loss ascertained from the measured voltage Umess as an input variable. This method is comparatively complex.

SUMMARY

In an embodiment, the present disclosure provides a method for determining an electric current Is. The method includes sending the electric current Is to be measured through a shunt arrangement. The shunt arrangement includes at least three identical resistor elements, each respective identical resistor element having, at identical temperatures, a same resistance value. The at least three identical resistor elements are thermally coupled in an identical way to a common base plate, and the at least three resistor elements are electrically interconnected such that the electric current Is is, when flowing through the shunt arrangement, at least partially divided such that a first local electric current I1 through a first resistor element is not equal to a second local electric current I3 through a second resistor element. The method also includes measuring, at the shunt arrangement, at least a first voltage and a second voltage, via which the voltage dropping across a first respective resistor element and the voltage dropping across a second respective resistor element are directly or indirectly determinable. The method additionally includes determining the electric current Is via the first voltage and the second voltage. A heating in the shunt arrangement generated by the electric current Is is at least partially taken into account in the determining the electric current Is.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following:

FIG. 2 shows a table for illustrating the effect of the method for determining an electric current in multiple variants;

DETAILED DESCRIPTION

Figure 1:
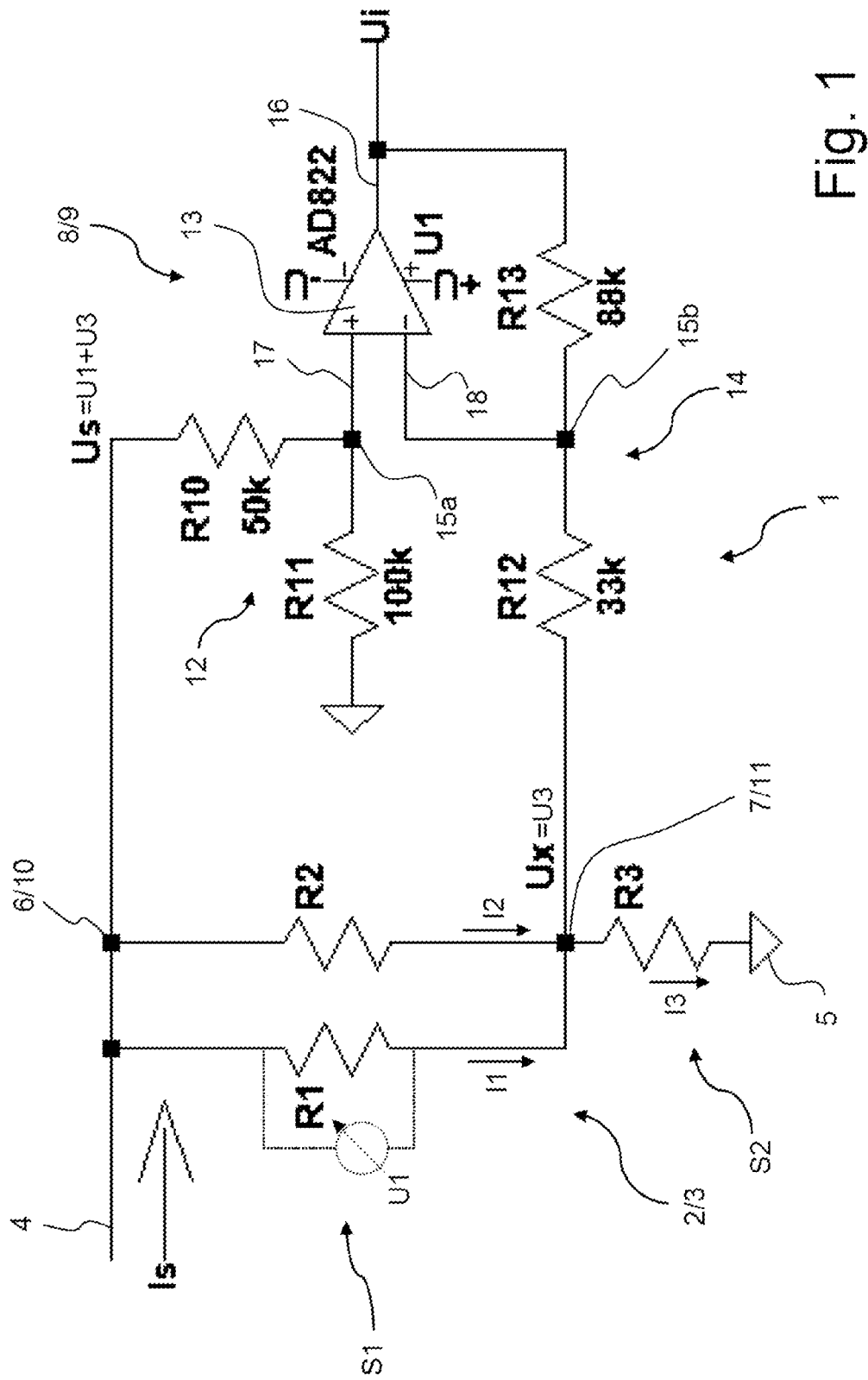
FIG. 1 shows a schematic representation of a first embodiment of a measuring arrangement for carrying out a method for determining an electric current, including an analog computing circuit.

The present disclosure provides a method for measuring an electric current with a shunt arrangement, wherein an at least partial compensation of the heating of the shunt arrangement induced by the current can be carried out in an easy way.

A first aspect of the disclosure provides a method of the type mentioned at the outset, which provides that the shunt arrangement is formed from at least three identical resistor elements (R1, R2, R3), which, at identical temperatures, have the same resistance value and which are thermally coupled to a common base plate in an identical way, that the resistor elements are electrically interconnected in such a way that the electric current Is flowing through the shunt arrangement is at least partially divided, and so a first local electric current I1 through a first resistor element (R1) is not equal to a second local electric current I3 through a second resistor element (R3), that at least a first voltage and a second voltage are measured at the shunt arrangement, by means of which the voltage dropping across the first resistor element and the voltage dropping across the second resistor element are directly or indirectly determinable, and that the electric current Is is determined by means of the measured first voltage and the measured second voltage.

Due to the interconnection of the (identical) resistor elements in the shunt arrangement, it is achieved that a different electric power drops at least in the first resistor element and in the second resistor element due to the different local electric currents I1, I3. Correspondingly, these resistor elements are heated up to different extents, and these resistor elements assume different temperatures.

According to the temperature coefficient of the resistor elements, the first resistor element and the second resistor element then have different electrical resistances. As a result in turn the voltage drops at the first resistor element and at the second resistor element are affected; temperature information regarding the first and the second resistor elements is therefore contained in the first voltage and in the second voltage (without a temperature of a resistor element as such being measured).

This temperature information included in the first voltage and the second voltage can be used (together with the knowledge of the electrical interconnection of the shunt arrangement) for back-calculating (compensating for) the heating that occurred and the temperature dependence of the electrical resistance of the resistor elements. In particular, on the basis of the measured first voltage and the measured second voltage, a compensated voltage drop Ui can then be determined, which would drop when the current Is to be measured flows across a known (temperature-independent) resistor, for example, across one of the resistor elements, at a reference temperature T0 (for example, at 20° C.). The electric current can then be easily determined with this compensated voltage drop. Ohm's law can be applied for this purpose, with Is=Ui/R(T0).

The temperature dependence of the resistance (also referred to as a resistance value) of a resistor element is given by R(T0+dT)=R(T0)+R(T0)*TK*dT, with dT: temperature difference of the resistor element with respect to the reference temperature T0, and TK: temperature coefficient. R(T0) and TK are typically provided in the data sheet of the resistor elements. The identical resistances have, at identical temperatures, identical resistance values (identical resistance values R(T0) at reference temperature T0 and identical thermal coefficients TK), and are thermally coupled to a common base plate in an identical way (identical thermal transfer resistances Rth to the common base plate); the identical resistances exhibit an identical behavior when generating thermal output.

Due to the fact that the resistor elements are identical and are thermally coupled to the base element in an identical way, neither the thermal transfer resistance Rth of the resistor elements to the base plate nor the temperature coefficient TK of the resistor elements are required for the compensation calculation; these variables are then cancelled out in the compensation calculation. The static and dynamic temperature behavior of the resistor elements does not affect the compensation calculation. In addition, the temperatures of the resistor elements as such do not need to be determined for the compensation calculation.

The base plate ("cooling plate") is typically held at the reference temperature T0. The reference temperature is typically 20° C. The base plate can be temperature-controlled for this purpose by means of a simple control circuit; in most cases it suffices, however, when the base plate has a high heat capacity and/or is thermally well coupled to the (temperature-stable) surroundings (with respect to the anticipated heat output of the resistor elements in each case).

Preferred Variants

In one preferred variant of the method according to the first aspect, it is provided that, for the determination of the electric current Is from the first voltage and the second voltage, it is assumed that an instantaneous temperature difference dT exists between a resistor element and a reference temperature T0, wherein the instantaneous temperature difference dT is proportional to an electric power P instantaneously dropping at the resistor element. This assumption for the measurement considerably simplifies the compensation calculation and is generally accurate, in good approximation, in practical application. In particular in the case of resistor elements having a low heat capacity and base plates having, by comparison, a high heat capacity, and a good thermal coupling of the resistor element to the base plate, the thermal equilibrium assumed here is achieved at the beginning of or a change in the current flow after a minimum amount of time. The temperature difference of the ("first") resistor element R1 (or of its temperature T1) with respect to the reference temperature T0 is designated as dT1, the temperature difference of the resistor element R2 (or of its temperature T2) with respect to the reference temperature T0 is designated as dT2, the temperature difference of the ("second") resistor element R3 (or of its temperature T3) with respect to the reference temperature T0 is designated as dT3, etc.

Moreover, a variant is preferred, in which, for the determination of the electric current Is from the first voltage and the second voltage, it is assumed that the following applies for a ratio dT3/dT1 and a ratio I3/I1:

$$dT3/dT1=(I3/I1)2,$$

with dT1: instantaneous temperature difference of the first resistor element (R1) with respect to the reference temperature T0, dT3: instantaneous temperature difference of the second resistor element (R3) with respect to the reference temperature T0. This assumption also simplifies the compensation calculation and is applied primarily when the currents I1, I3 in the resistor elements only result in comparatively low heating.

A variant is also preferred, in which, for the determination of the electric current Is from the first voltage and the second voltage, it is assumed that the following applies for an instantaneously dropping power P=R(T0)*I2 in a resistor element, with T0: reference temperature, R(T0): resistance value of the resistor element at reference temperature T0; I: instantaneous current through the resistor element. This also simplifies the compensation calculation. Here it is assumed that the thermal output at a resistor element depends only on the local electric current, but not on the temperature of the resistor element.

In an alternative advantageous variant, for the determination of the electric current from the first voltage and the second voltage, it is assumed that the following applies for an instantaneously dropping power $P(T0+dT)=R(T0+dT)*I2$ in a resistor element, with $T0$: reference temperature, $R(T0+dT)$: instantaneous resistance value of the resistor element at the temperature $T0+dT$; $dT$: instantaneous temperature difference of the resistor element with respect to the reference temperature $T0$, $I$: instantaneous current through the resistor element. This assumption makes the compensation calculation somewhat more complex, but yields more accurate measurement results for the current Is. In this variant, it is taken into account that a resistor element that has heated up (with respect to the reference temperature $T0$) consumes another (higher) power than at the reference temperature $T0$ given an identical local electric current.

A variant is also preferred, in which a temperature-compensated voltage drop Ui is at least approximately determined from the first voltage and the second voltage, the temperature-compensated voltage drop Ui corresponding to the voltage drop of the applied electric current Is to be measured across a resistor element at reference temperature (T0) or a multiple thereof. This approach for determining the current Is is particularly simple. The voltage drop Ui can be converted to the current Is using Ohm's law, if necessary using the proportionality factor (corresponding to the aforementioned multiple). It is to be noted that the determination of Ui usually takes place only approximately, for example, with an accuracy of 20% or better, preferably with an accuracy of 10% or better, and further preferably wherein this accuracy is valid in a range of at least two orders of magnitude (factor 100) of Is, particularly preferably over at least three orders of magnitude (factor 1000) of Is.

A further development of this variant is particularly preferred, in which the determination of Ui is carried out by an analog computing circuit, wherein the analog computing circuit has an input for the first voltage and an input for the second voltage. With the analog computing circuit, Ui (generally within the scope of a certain approximation) can be made available easily and practically without delay.

In an alternative further development, it is provided that the first voltage and the second voltage are both digitized using an A/D converter, and the determination of Ui takes place digitally by means of a microprocessor. As a result, Ui can be determined with particularly high accuracy and practically any formula interrelationships between the two measured voltages and Ui can be programmed.

A further development is advantageous that provides that a temperature of the base plate is measured by means of a temperature sensor and a temperature difference dTP of the base plate with respect to the reference temperature T0 is determined, and that the temperature-compensated voltage drop Ui is additively corrected with a correction voltage Ukorr, wherein the correction voltage Ukorr is proportional to $Is*dTP*TK*R(T0)$, with TK: temperature coefficient of the resistor elements at reference temperature, R(T0) resistance value of the resistor element at reference temperature. This approach is advantageous when the temperature of the base plate significantly fluctuates, for example, because the ambient temperature also significantly fluctuates, or a heat input into the base plate by means of the resistor elements with respect to the thermal coupling of the base plate to the surroundings is no longer negligible. If Ui corresponds ("not a multiple") to the voltage drop of Is across precisely one resistor element through which Is completely flows, then $Ukorr=Is*dTP*TK*R(T0)$.

Variants Based on a Voltage Divider Circuit

A variant is particularly preferred, in which the shunt arrangement is designed as a voltage divider circuit, including a first circuit part and a second circuit part, wherein the first circuit part and the second circuit part are connected in series. This configuration of the shunt arrangement is particularly simple. In addition, voltages at the voltage divider circuit can be particularly easily evaluated using a differential amplifier. As first and second voltages, typically two of the following variables are measured: voltage drop across the entire shunt arrangement (Us), voltage drop across the first circuit part (U1), voltage drop across the second circuit part (Ux). In particular, Us and Ux can be measured (tapped). Alternatively, individual voltages can also be measured within the first and the second circuit parts.

A development is particularly preferred that provides that the first circuit part includes N resistor elements that are connected in parallel to one another, with N≥2, and that the second circuit part includes one resistor element or M resistor elements that are connected in parallel to one another, with M≥2 and N>M. A local current then flows through the resistor elements in the first circuit part that is lower than the current flowing through the resistor elements in the second circuit part. As a result, different local currents I1 and I2 can be effectuated in an easy way.

A development is particularly preferred, in which the first circuit part includes precisely two resistor elements, which are connected in parallel to each other, and the second circuit part includes precisely one resistor element. This configuration, which is formed overall by three identical resistor elements, is structurally particularly simple and easily entered in a compensation calculation. Precisely the current Is/2 flows in the resistor elements of the first circuit part and precisely the current Is flows in the resistor element of the second circuit part. The corresponding voltage divider configuration is also referred to in the following as "voltage divider circuit with 1:2 current sharing."

A development is also advantageous that provides that a voltage drop Us across the entire shunt arrangement is measured as a first voltage and a voltage drop Ux across the second circuit part is measured as a second voltage, that a compensated voltage drop Ui is at least approximately determined from Us and Ux, the compensated voltage drop Ui corresponding to the voltage drop of the flowing electric current Is, which is to be measured, across a resistor element at reference temperature T0, and that the electric current Is flowing through the shunt arrangement is therefore determined according to $Is=Ui/R(T0)$, with $R(T0)$: resistance of the resistor element at reference temperature T0. This approach is particularly easily implemented in practical application.

A sub-variant of this development is preferred that provides a voltage divider circuit having 1:2 current sharing and also that Ui is determined according to $Ui=8*Us/3-3*Ux$. By means of this formula, Ui is already fairly well approximated; the formula is based on the assumption of a voltage divider circuit that includes two parallel resistors in the first circuit part and one resistor in the second circuit part (see above). In addition, the Ui can be approximately depicted according to this formula relatively well by means of an analog computing circuit. If Ui is determined by means of an analog computing circuit, the aforementioned formula is typically only approximated, for example, via $Ui=Us*22/9-Ux*8/3=Us*2/3+(Us*2/3-Ux)*8/3$. The approximation is carried out, for example, with an error of 20% or less (overall or also with respect to each summand), preferably 10% or less, particularly preferably 5% or less. The approximation formula can additionally include a correction factor KF, for example, with $Ui=Us*2/3+KF*(Us*2/3-Ux)*8/3$. Typically KF<1 is selected. For cases of low heating, for example, $0.988 \leq KF \leq 0.996$ or also approximately KF=0.992 can be advantageous. In cases of greater heating, KF with $0.85 \leq KF \leq 0.95$ can be selected. As a result, an over-compensation of the heating of the resistor elements can be reduced.

A sub-variant of the above-described further development is also preferred that provides a voltage divider circuit having 1:2 current sharing and also that Ui is determined according to $Ui=3*Ux*(Us-Ux)/(3*Ux-Us)$. By means of this formula, Ui is even more precisely approximated; the formula is also based on the assumption of a voltage divider circuit that includes two parallel resistors in the first circuit part and one resistor in the second circuit part (see above). This formula also takes into account a change in the thermal output due to the heating of the resistor element as compared to a resistor element at the reference temperature T0 given an identical local current. This formula is typically used by a digital calculation of Ui.

A sub-variant of the above-described further development is particularly preferred, which provides that the determination of Ui is carried out by an analog computing circuit, and that the analog computing circuit includes: a high-resistance voltage divider, the voltage division factor of which corresponds to a voltage division factor of the voltage divider circuit of the shunt arrangement, wherein an input of the analog computing circuit for Us is connected to the high-resistance voltage divider, in particular wherein the high-resistance voltage divider of the analog computing circuit is configured including voltage divider resistors that have a resistance value that is greater than the resistor elements of the voltage divider circuit of the shunt arrangement by at least 104, preferably at least 105, an operation amplifier voltage divider, wherein an input of the analog computing circuit for Ux is connected to the operation amplifier voltage divider, an operation amplifier, wherein a non-inverting, first operation amplifier input is connected to a center tap of the high-resistance voltage divider, and an inverting, second operation amplifier input is connected to a center tap of the operation amplifier voltage divider, and Ui is output at an output of the operation amplifier.

The operation amplifier voltage divider is connected with its first end to the input for Ux, and with a second end to the output of the operation amplifier.

With this configuration, an analog computing circuit can be easily configured, with which Ui can be approximately determined and made available (at the output of the operation amplifier). The configuration is suitable in particular for a voltage divider circuit with 1:2 current sharing in the shunt arrangement (see above); the following examples generally relate thereto.

With this analog computing circuit, Ui can be approximately determined, for example, according to $$Ui=8*Us/3-3*Ux \text{ or}$$

$$Ui=Us*22/9-Ux*8/3=Us*2/3+(Us*2/3-Ux)*8/3$$

The operation amplifier voltage divider preferably applies a voltage division factor of 3/8. The voltage division factor can be construed as the ratio of the (total) resistance of the series-connected circuit parts of a voltage divider.

The operation amplifier voltage divider can be configured including an additional resistance, by means of which the Ui output at the output of the operation amplifier deviates slightly from the target Ui from one of the aforementioned formulas (in particular from the formula $Ui=8*Us/3-3*Ux$ or $Ui=Us*22/9-Ux*8/3=Us*2/3+(Us*2/3-Ux)*8/3$), as the result of which an over-compensation of the heating of the resistor elements can be reduced, for example, according to $Us*2/3+KF*(Us*2/3-Ux)*8/3$. The latter formula can alternatively also be programmed via a microprocessor.

The difference amplified by a factor×(voltage at the positive input)−Ux, for example, $[x*(Us*2/3-Ux)]$, is added to the voltage, for example, $Us*2/3$, applied at the positive (=first/non-inverting) input of the operation amplifier. The factor x of the amplification is set by (resistance of the output of the operation amplifier with respect to the negative (=second/inverting) input of the operation amplifier)/(resistance of Ux with respect to the negative input of the operation amplifier), for example, with (x=8/3).

Further Aspects

The present disclosure also covers the use of an above-described method for determining an electric current Is in an NMR instrument, in particular in a gradient current amplifier circuit of an NMR instrument. The electric current in the NMR instrument can be particularly precisely determined and/or set, which enables particularly precise NMR measurements (spectra and/or image recordings).

The scope of the present disclosure also covers a measuring arrangement for determining an electric current Is, including a shunt arrangement, which includes at least three identical resistor elements, which, at identical temperatures, have the same resistance value and are thermally coupled to a common base plate in an identical way, wherein the resistor elements are electrically interconnected in such a way that the electric current Is flowing through the shunt arrangement is at least partially divided, and so a first local electric current I1 through a first resistor element (R1) is not equal to a second local electric current I3 through a second resistor element (R3), two voltage taps, with which the voltage dropping across the first resistor element and the voltage dropping across the second resistor element are directly or indirectly determinable, and an evaluation unit, with which the electric current Is is determinable from the voltages measured at the voltage taps.

The measuring arrangement can in particular be used in an aforementioned method. With the measuring arrangement, precise measurements of the current Is are possible in an easy way, wherein a heating of the resistor elements by the current to be measured is at least partially compensated. The evaluation unit can in particular include an analog computing circuit, or also two A/D converters and a downstream microprocessor.

Further advantages can be gathered from the description and from the drawing. The aforementioned features and the features described further below can also be used alone or in combination. The embodiments that are shown and described are not intended to be a conclusive list, but rather serve as examples for the purpose of explanation.

First Embodiment of a Measuring Arrangement

FIG. 1 schematically shows a circuit diagram of a first embodiment of a measuring arrangement 1, with which the measuring method, in an exemplary variant, can be carried out.

The measuring arrangement 1 includes a shunt arrangement 2, which is formed here as a voltage divider circuit 3.

The shunt arrangement 2 includes three identical resistor elements R1, R2, R3 in this case. It is to be noted that the reference signs R1, R2, R3 are also used, for the sake of simplicity, in physical formulas for the associated resistance value of these resistor elements R1, R2, R3, generally together with a temperature indication given in brackets, since the resistance values R1, R2, R3 are temperature-dependent. The resistance values R1, R2, R3 are typically in the mOhm range.

All resistor elements R1, R2, R3 have an identical dependence of their resistance value R on the temperature T, with $R=R(T0)+R(T0)*dT*TK$, with R(T0): resistance value at reference temperature T0, TK: temperature coefficient, dT: temperature difference between the resistor element (with temperature T) and the reference temperature T0. The values R(T0), TK, and T0 can typically be found in the data sheet for the installed resistor element. Usually a temperature of 20° C. (corresponding to room temperature) is selected as reference temperature T0. In addition, all resistor elements are connected to a common base plate (being fastened to the base plate) in an identical way, thereby establishing a thermal transfer resistance Rth that is identical for all resistor elements R1, R2, R3.

The input 4 of the shunt arrangement 2 is serially connected to a consumer/utility device, through which a current Is flows, the amperage of which is to be determined using the measuring arrangement 1. The consumer or the utility device is, for example, a gradient coil of an NMR instrument. This current Is also flows through the shunt arrangement 2 from the input 4 to an output 5. The output 5 of the shunt arrangement 2 is connected to ground in this case.

The shunt arrangement 2, which is formed as the voltage divider arrangement 3, includes, in the embodiment shown, a first circuit part S1, which is made up of a parallel circuit of N=2 resistor elements, specifically the resistor elements R1 and R2 in this case. Moreover, the voltage divider arrangement 3 includes a second circuit part S2, which is made up only of a single resistor element in this case, specifically the resistor element R3 in this case. The two circuit parts S1, S2 are connected in series.

Since the resistance values R1, R2 are always identical (even if heating should occur due to the current measurement) due to the identical nature of the associated resistor elements and the identical thermal connection to the base plate, the current Is splits uniformly according to the number N=2 of resistor elements R1, R2 in the first circuit part S1. The following applies for the local currents I1, I2 through the resistor elements R1, R2: I1=I2=Is/2. Through the resistor element R3 in the second circuit part S2, the local current I3 is equal to the current Is, i.e., I3=Is. The currents I1, 1I, I3 result according to Kirchhoff's rules.

The resistor element R1 is also referred to as a first resistor element R1, and the resistor element R3 is also referred to as a second resistor element R3.

In the embodiment shown, it is provided that the voltage drop Us across the overall shunt arrangement 2 is measured and the voltage drop Ux across the second resistor element R3 (which corresponds to the voltage drop U3 across the second circuit part S2) is measured. It is particularly easy to measure Us and Ux since these voltages can be measured directly with respect to ground. Alternatively it would also be possible, for example, to measure the voltage drop U1 across the first resistor element R1 instead of Ux or Us. It is to be noted that Us=U1+Ux, and so the measurement of any two of the voltages Us, Ux, U1 contains the information regarding all three voltages Us, Ux, U1. The voltage Us is also referred to as a first voltage and the voltage Ux is also referred to as a second voltage.

It is assumed that the current Is to be measured is not significantly affected by the shunt arrangement 2 (this assumption is justified in general when the resistance of the consumer/utility device is considerably greater than the resistance of the shunt arrangement 2). The current Is can significantly heat up the resistor elements R1, R2, R3, however, which can significantly affect their resistance values. This affects in turn the voltage drop across the resistor elements R1, R2, R3. Due to the different local currents I1, I3 in the resistor elements R1, R3, the resistor elements R1, R3 heat up to different extents. Since the temperature dependence of the resistance values and also the thermal coupling to the base plate are identical for all resistor elements R1, R2, R3, however, the amperage Is can be measured without knowledge of the temperatures at the resistor elements R1, R2, R3 and without knowledge of TK or Rth. This takes place here due to the fact that, based on the measured voltages Us and Ux, an equivalent voltage Ui (also referred to as a temperature-compensated voltage drop) is determined, which at least approximately corresponds to the voltage drop across one of the resistor elements R1, R2, R3 when the full current Is would flow through this resistor element at the reference temperature T0. Derivations of the approximate determination of Ui from Us and Ux are described further below (see there).

The voltage Us, which is measured at a voltage tap 6, and the voltage Ux, which is measured at a voltage tap 7, are processed by an evaluation unit 8, which is formed in this case with an analog computing circuit 9. The voltage tap 6 is simultaneously the input 10 for the first voltage Us, and the voltage tap 7 is simultaneously the input 11 for the second voltage Ux.

The analog computing circuit 9 is formed here with a high-resistance voltage divider 12, including the serially connected resistor elements R10 and R11. These resistor elements R10, R11 have resistance values in the kOhm range or higher, and so the currents flowing through the high-resistance voltage divider 12 are low as compared to the currents in the shunt arrangement 2, and also no significant heating occurs in the high-resistance voltage divider due to the currents flowing through. The resistance value R10 of 50 kOhm is half as great here as the resistance value R11 of 100 kOhm (voltage division factor 2/3), and so the voltage in the high-resistance voltage divider 12 is divided in the same way as the currents in the voltage divider arrangement 3 (I1 is half as great as I3); the voltage divider circuit 3 also has (at reference temperature T0) a voltage division factor of 2/3. The high-resistance voltage divider 12 is connected to the resistor element R10 at the input 10, includes a center tap 15a, and is also connected to ground with the resistor element R11.

Moreover, the analog computing circuit 9 includes an operation amplifier 13 and an operation amplifier voltage divider 14. The operation amplifier voltage divider 14 includes the serially connected resistor elements R12 and R13. The operation amplifier voltage divider 14 is connected to the resistor element R12 at the input 11, includes a center tap 15b, and is connected to the resistor element R13 at an output 16 of the operation amplifier 13.

The resistor elements R12, R13 also have resistance values in the kOhm range or higher, and so the currents flowing through the operation amplifier voltage divider 14 are low as compared to the currents in the shunt arrangement 2, and also no significant heating occurs in the operation amplifier voltage divider 14 due to the currents flowing through. The resistance value R12 of 33 kOhm and the resistance value R13 of 88 kOhm yield a voltage division factor 3/8 of the operation amplifier voltage divider 14.

The center tap 15a of the high-resistance voltage divider 12 is connected to the positive (non-inverting, first) input 17 of the operation amplifier 13 and the center tap 15b is connected to the inverting (negative, second) input 18 of the operation amplifier 13. The equivalent voltage Ui is tapped at the output 16 of the operation amplifier 13.

The function of the operation amplifier 13 is the following: The difference, which has been amplified by a factor x, between the voltage of Us*2/3 applied at the positive input 17 and the voltage at the output 11 of Ux is added to the voltage of Us*2/3 applied at the positive input 17. The factor x of the amplification results from the quotient of the resistance value of the output 16 of the operation amplifier 13 with respect to the negative input 18 and the resistance value of the input 11 with respect to the negative input 18 of the operation amplifier 13, i.e., x=88 kOhm/33 kOhm=8/3. The equivalent voltage Ui with the analog computing circuit 8 therefore results as $$Ui=Us*2/3+8/3*(Us*2/3-Ux) \quad \text{(Equation 1)}$$

or further transformed $$Ui=22/9*Us-8/3*Ux. \quad \text{(Equation 2)}$$

By means of equation 2, the formula according to equation 3 for the voltage divider circuit 3 calculated further below $$Ui=8/3*Us-3*Ux \quad \text{(Equation 3)}$$

is approximated. The summand of Us in equation 2 deviates slightly, by approximately 8%, from the summand of Us in equation 3, and the summand of Ux in equation 2 deviates slightly, by approximately 11%, from the summand of Ux in equation 3.

It is to be noted that the factor x can be slightly changed by changing the resistances R12 and R13, as the result of which a correction factor KF can be realized, cf. the formula of equation 32, below. If, for example, R12 is slightly increased (which can take place due to an additional resistance connected in series with R12), a correction factor KF less than 1 can be realized. If, for example, an additional resistance of 5 kOhm is connected in series to R12, the factor x changes to 88/38=2.31, which would correspond to a correction factor of 0.87 according to 8/3*0.87=2.31 (not described in greater detail).

Based on the equivalent voltage Ui applied at the output 16, the current Is can then be approximately determined via Ohm's law via conversion according to Is=Ui/R(T0).

Control calculation for equation 2: In the non-heated-up state, the temperature of the resistors is equal to T0. Then Us=Ux*3/2. Equation 2 then yields: Ui=22/9*3/2*Ux-8/3*Ux=66/18*Ux-48/18*Ux=18/18*Ux=Ux, as expected.

Approximation Formula for the Equivalent Voltage Ui—Simple Approximation

In the following, a formula for the equivalent voltage Ui is to be derived by way of example for the shunt arrangement 2 from FIG. 1, the equivalent voltage Ui corresponding to a voltage drop across one of the resistor elements (for example, R3) at the reference temperature T0. If index numbers are used behind variables, these correspond in the following to the index number of the resistor element in FIG. 1.

The resistance value R of a resistor element at the temperature T=T0+dT is $$R(T)=R(T0+dT)=R(T0)+R(T0)*TK*dT \quad \text{(Equation 4)}$$

with R(T0): resistance value at reference temperature T0. Correspondingly, the following applies, for example, at the first resistance element R1 and at the second resistance element R3:

$$R1(T1)=R(T0+dT1)=R(T0)+R(T0)*TK*dT1 \quad \text{(Equation 5a)}$$

$$R3(T3)=R(T0+dT3)=R(T0)+R(T0)*TK*dT3 \quad \text{(Equation 5b)}$$

In thermal equilibrium, the following generally applies for a temperature difference dT setting in at a thermal transfer resistance Rth at a power loss (corresponding to a heat flow) P $$dT=P*Rth \quad \text{(Equation 6)}$$

The power loss P from resistance heating at a resistor R given a current I flowing through is, in general, $$P=R*I^2 \quad \text{(Equation 7)}$$

Within the scope of the simplified approximation, it is to be assumed that the power loss P in the resistor element depends only on the present current I; a heating of the resistor element during the power consumption is to be ignored. Therefore, equation 7 is simplified to $$P=R(T0)*I^2 \quad \text{(Equation 8)}$$

Under consideration of I1=Is/2 and I3=Is, the following then results for the resistor elements R1 and R3 for dT1 and dT3 from equation 6

$$dT1=R(T0)*Is^2/4*Rth \quad \text{(Equation 9a), and}$$

$$dT3=R(T0)*Is^2*Rth \quad \text{(Equation 9b)}$$

Equations 9a and 9b then yield $$dT3=4*dT1. \quad \text{(Equation 10)}$$

Equation 5b, with equation 10, then yields $$R3(T3)=R(T0)+R(T0)*TK*4*dT1 \quad \text{(Equation 11)}$$

and transformed $$[R3(T3)-R(T0)]/4=R(T0)*TK*dT1 \quad \text{(Equation 12)}$$

Equation 5a also yields $$R1(T1)-R(T0)=R(T0)*TK*dT1 \quad \text{(Equation 13)}$$

Equation 12 and equation 13 then yield $$[R3(T3)-R(T0)]/4=R1(T1)-R(T0) \quad \text{(Equation 14)}$$

Equation 14 can then be solved for R(T0) as $$R(T0)=4*R1(T1)/3-R3(T3)/3. \quad \text{(Equation 15)}$$

The equation can be multiplied by Is on both sides; under consideration of Ui=Is*R(T0), this yields $$Ui=Is*4*R1(T1)/3-Is*R3(T3)/3 \quad \text{(Equation 16)}$$

Under consideration of R1(T1)=U1/(Is/2) and R3(T3)=U3/Is, according to Ohm's law, this yields $$Ui=Is*4*U1/[3*(Is/2)]-Is*U3/(3*Is) \quad \text{(Equation 17)}$$

Is can be cancelled out, and continuing with U3=Ux and U1=Us-Ux, this yields $$Ui=8/3*(Us-Ux)-Ux/3 \quad \text{(Equation 18)}$$

which, transformed, yields (see also equation 3, above)

$$Ui=8/3*Us-3*Ux. \quad \text{(Equation 19)}$$

Using equation 19, a very good correction of the current measurement with respect to the heating of the resistor elements can already be achieved in many cases; the formula from equation 19 can be comparatively easily approximately implemented, for example, with an analog computing circuit (see explanation for FIG. 1, above). The formula from equation 19 could also be implemented via a digital calculation. The current Is can be determined via Is=Ui/R(T0).

N.B.: If a voltage divider configuration of the shunt that is different from A=0.5 to B=1 (with A, B: relative current components of the first resistor element and of the second resistor element of Is) is used, a general calculation is:

$$Ui = Us * [((A+B)/A)^2 - 1]/(A+B)/A - (A+B)/A * Ux \quad \text{(Equation 19A)}$$

Further Approximation Formula for the Equivalent Voltage Ui—Taking Heating of the Resistor Element into Account with the Power Loss For a further approximation formula of Ui, it is then to be taken into account that a resistor element that has heated up with respect to the reference temperature T0 consumes a different power at an identical current than at the reference temperature. Instead of the aforementioned equation 8, the following then applies at the temperature T=T0+dT $$P(T0+dT) = R(T0+dT) * I^2 \quad \text{(Equation 20)}$$

The following then applies for the temperature differences, cf. equation 6, above, with I1=Is/2 and I2=Is $$dT1 = R(T1) * Is^2 / 4 \quad \text{(Equation 21a); and}$$

$$dT3 = R(T3) * Is^2 \quad \text{(Equation 21b)}$$

Equation 21a and equation 5a yield $$R1(T1) = R(T0) + R(T0) * TK * Rth * R1(T1) * Is^2 / 4 \quad \text{(Equation 22)}$$

which can be transformed to $$4 - 4 * R(T0)/R1(T1) = R(T0) * TK * Rth * Is^2. \quad \text{(Equation 23)}$$

In addition, equation 21b and equation 5b yield $$R3(T3) = R(T0) + R(T0) * TK * Rth * R3(T3) * Is^2 \quad \text{(Equation 24)}$$

which in turn can be transformed to $$1 - R(T0)/R3(T3) = R(T0) * TK * Rth * Is^2 \quad \text{(Equation 25)}$$

Equation 23 and equation 25 then further yield $$1 - R(T0)/R3(T3) = 4 - 4 * R(T0)/R1(T1) \quad \text{(Equation 26)}$$

Equation 26 should then be solved for R(T0). For this purpose, the following transformation from equation 26 initially takes place $$4 * R(T0)/R1(T1) - R(T0)/R3(T3) = 3 \quad \text{(Equation 27)}$$

Cancelling out R(T0) and dividing by the remaining factor then yields $$R(T0) = 3/[4/R1(T1) - 1/R3(T3)]. \quad \text{(Equation 28)}$$

In the divisor of the fraction on the right in equation 28, the common denominator can then be formed and used to multiply both sides; this yields $$R(T0) = 3 * R1(T1) * R3(T3)/[4 * R3(T3) - R1(T1)] \quad \text{(Equation 29)}$$

Then in turn, with Ui=Is*R(T0) and R1(T1)=U1/(Is/2) and R3(T3)=U3/Is, equation 29 yields the following:

$$Ui = Is * 3 * [U1/(Is/2)] * [U3/Is]/[4 * U3/Is - U1/(Is/2)] \quad \text{(Equation 30)}$$

Then U3=Ux and U1=Us-Ux can be inserted into equation 30 and Is can be cancelled out, thereby yielding $$Ui = 3 * (Us-Ux) * 2 * Ux/[4 * Ux - 2 * (Us-Ux)] \quad \text{(Equation 30)}$$

Finally, equation 30 can be further transformed into $$Ui = 3 * Ux * (Us-Ux)/(3 * Ux - Us) \quad \text{(Equation 31)}$$

Ui can be comparatively precisely determined using this formula. Typically this formula is applied via an appropriately programmed microprocessor (cf. also FIG. 3, below). The current Is can be determined via Is=Ui/R(T0).

Effectiveness of the Compensation Method

The benefit of the method can be illustrated with reference to the table from FIG. 2. The top row of the table contains an alphabetic indexing of the columns from A through L. In the bottom row, the spreadsheet formula applied in every row of the associated column is explained (provided this applies in this column). A numbering of the rows in which a calculation was carried out is entered in column L (from CN1 through CN21).

If a simple resistor element is used for measuring a current Is without any compensation, the current Is is ascertained with Is=U/R(T0), i.e., according to Ohm's law, and wherein U is the voltage drop across the resistor element and R(T0) is the resistance of the resistor element at the reference temperature T0. If the current Is does not cause any heating of the resistor element with respect to the reference temperature T0, the current Is is correctly ascertained. The voltage U dropping at the resistor element (referred to as Ux in the table) corresponds in this case to the equivalent voltage Ui, which would arise as a voltage drop at the temperature T0 at the resistor element with resistance value R(T0) at the given current Is, and the error of Ux with respect to Ui is zero (cf. row CN1).

If the current Is then does cause the resistor element to heat up, however, an error arises in the current measurement, which the columns A, B, and C can illustrate. The voltage drop Ux in the error-free/non-heated-up case (row CN1) is standardized to Ux=1 here. If the voltage Ux increases due to heating, as shown in column B, this results in a percentage error, which is shown in column C. In row CN2, for example, the current Is has caused a voltage of 1.1 to drop at the resistor element. If the calculation Is=Ux/R(T0) is then carried out, an error of 10% occurs, since R(T0) was used in the transformation. In the further rows up to CN21, even greater voltage changes Ux due to the current or the associated heating were assumed, up to Ux=3 (corresponding to a 200% change with respect to Ux=1; Ux changes by 0.1 from row to row). Column A shows that the equivalent voltage Ui=1 should have been applied in the calculation in all cases of heating for a correct current measurement when using R(T0) in Ohm's law, in order to arrive at the correct current Is. Ux deviates from Ui by the error in column C, however, which results in a corresponding error in the current measurement. The error increases linearly with Ux, up to 200% for Ux=3. If only a simple resistor element is used, the equivalent voltage Ui can be readily ascertained from Ux.

It is then to be assumed that a measuring arrangement, as shown in FIG. 1, is used for measuring the current Is. The voltage Ux from column B then corresponds to the voltage drop across the second resistor R3 (see FIG. 1). In addition, Ux is standardized in such a way that, in the absence of heating, Ux=Ui=1 (if, for example, Is=5 A and R3=0.2, then Ux is 1 volt). Ux increases from 1 to 3 in increments of 0.1 in the table.

The column D shows the value of Us that would result for associated different temperatures. The formula from equation 31 was applied for the calculation of column D, wherein Ui=1 was applied.

Checking Equation 19

For column E, Us was approximately determined by means of the formula from equation 19. It is clearly apparent that the column E deviates only slightly from the column D.

For the column F, Ui was determined according to the formula from equation 19, i.e., with Ui=8/3*Us−3*Ux. Ux was taken from column B and Us was taken from column D. Column G lists the percentage error of Ui mess from column F with respect to Ui from column A. It is clearly apparent that the error in column G is considerably smaller overall than in column C. In particular, for the greatest voltage increase to Ux=3 in row CN21, the error of 200% in column C can be reduced to 40% in column G, and for values of Ux up to approximately 1.5 (cf. row CN6), the error in column G can be held below 5%, while the error is already 50% in column C.

Checking Equation 1

In column H, Ui mess altern was determined according to the formula from equation 1, i.e., with Ui=Us*2/3+8/3*(Us*2/3−Ux). Equation 1 is an approximation of equation 19, and the analog computing circuit from FIG. 1 implements equation 1, and so Ui mess altern is output at the output of the operation amplifier. Us and Ux were in turn taken from columns D and B. Column I lists the percentage error of column H with respect to column A. For very small voltage changes (row CN2, Ux=1.1), the error from equation 19 in column G is somewhat smaller than with equation 1 in column I. For greater deviations (rows CN04 and higher), the application of equation 1 results in a somewhat lower error in column I than the application of the formula from equation 19 with its error in column G. In particular, for the greatest voltage increase to Ux=3 in row CN21, the error can be reduced from 40% to 20% (20% is the maximum error in the observed range for Ux from 1.1 to 3.0 in column I). The application of equation 1 therefore already yields a reduction of over-compensation, as would be effectuated by the formula from equation 19.

Additional Application of a Correction Factor KF

In column J, Ui mess altern mod was modified according to the formula from equation 1 by a correction factor KF determined with $$Ui \text{ mess altern mod}=Us*2/3+KF*(Us*2/3-Ux)*8/3 \quad \text{(Equation 32)}$$

wherein a correction factor KF of 0.90 was applied in the table shown. By incorporating the correction factor KF, in the range of Ux from 1.1 to 3.0 observed here, the maximum associated percentage error (shown in column K) of Ui mess altern mod from column J can be reduced even further than in column H; the maximum error in column K is only 4% (cf. row CN21), in contrast to the maximum error in column I of 20% (also in row CN21). The over-compensation of the heating in the equivalent voltage Ui can therefore be reduced even further.

If a minimization of the maximum error is sought for a different heating range than is considered in the table (there: Ux from 1.1 to 3.0), the correction factor KF can be appropriately optimized for that purpose. A maximum error (for example, 1%) can also be predefined, and the correction factor can be optimized in such a way that a heating range, within which this maximum error is maintained, becomes as great as possible. If, for example, a maximum error of 1% is predefined, a fairly large range (up to approximately Ux=1.7) can be obtained with a correction factor KF of 0.988≤KF≤0.996, preferably KF=0.992, the range including this error limit.

In the following, a brief overview of the columns used in FIG. 2 is presented once again:

Column A=Ui: Desired equivalent voltage, which via Is=Ui/R(T0) would yield the correct current Is; Ui in this case is always 1 due to standardization. Ui would also result at R3 if the temperature coefficient TK were zero.

Column B=Ux: assumed voltage drop at the resistor R3 (wherein Ux=1 is standardized for the non-heated-up case).

Column C=Error %: Error of the uncompensated current measurement (percentage error of B with respect to A).

Column D=Us: Sum U1+U3 of the voltage drops at the resistors R1 and R3.

Column E=Us approximately: Sum of the voltage drops at the resistors R1 and R3 calculated with the approximation formula Us=3*(Ui+3*Ux)/8.

Column F=Ui mess: Equivalent voltage Ui calculated with the formula from equation 19.

Column G=Error %: Error of the equivalent voltage from column F (percentage error of F with respect to A).

Column H=Ui mess: Equivalent voltage Ui calculated with the approximation formula from equation 1, the equivalent voltage Ui being generated at the output of the operation amplifier.

Column I=Error %: Error of the equivalent voltage from column H (percentage error of H with respect to A).

Column J, top=Corr fact: Correction factor, in this case KF=0.90.

Column J, bottom=Ui mess altern mod: Equivalent voltage Ui calculated with the approximation formula from equation 32, wherein KF=0.9 was applied.

Column K=error %: Error of the equivalent voltage from column J (percentage error of J with respect to A).

Column L=Calc. No.: Number of rows of the spreadsheet, in which the calculations from the previous row were applied.

Examples for the Table

As indicated above with respect to equation 9b, the temperature change at the resistor R3 results as dT3=R(T0)*Is2*Rth. According to the interrelationship of equation 4, which is R(T)=R(T0+dT)=R(T0)+R(T0)*TK*dT, a temperature-induced change in resistance dR3 results, namely $$dR3=R(T0)*Is2*Rth*TK. \quad \text{(Equation 33)}$$

Typical values for TK are usually between 50 ppm/° C. and 5000 ppm/° C., depending on the resistive material. For example, arc lamp carbon has a TK of approximately 500 ppm/° C., and gold has a TK of approximately 4000 ppm/° C., both at 20° C. Typical values for Rth are between 1° C./watt and 1000° C./watt, wherein values of less than 10° C./watt are to be expected at load resistances on heat sinks.

In the case of a first typical shunt arrangement that includes carbon-based resistors on a cooling plate (TK=500 ppm/° C., Rth=2° C./watt) having a resistance R(T0) at 20° C. of 0.1 ohm, if it is assumed that the resistance R3 increases by approximately 10% (i.e., dR3=0.1) during the current measurement, equation 33 then yields 0.1=0.1 ohm*Is2*2° C./watt*0.0005 1/° C. and, in addition, Is=32 A. Under these conditions, a current of 32 A could therefore be measured with good error compensation (cf. table from FIG. 2, row CN02) with an error (cf. columns G, I, or J) of approximately 1.3% or less (instead of uncompensated with an error of 10%) depending on the compensation method. The resistance would heat up by approximately 200° C. (ascertained from dR3 and TK, with 0.1/500 ppm/° C.); in this temperature range, TK typically also changes by only very little, and so the linear assumption of equation 4 is still highly applicable.

In the case of a second typical shunt arrangement that includes gold-based resistors on a cooling plate (TK=4000 ppm/° C., Rth=2° C./watt) having a resistance R(T0) at 20° C. of 0.01 ohm at 20° C., if it is assumed that the resistance R3 increases by approximately 100% (i.e., dR3=0.1) during the current measurement, equation 33 then yields 1.0=0.01 ohm*Is2*2° C./watt*0.004 1/° C. and, in addition, Is=112 A. Under these conditions, a current of 112 A with good error compensation (cf. table from FIG. 2, row CN11) with an error of considerably less than 15% (column G) could therefore be reduced already upon application of the simple compensation formula from column F (which corresponds to equation 19) (as compared to the uncompensated case with an error of 100%). Due to the compensation according to columns H and J, the error (columns I and K) can be reduced even further, to below 5%. The resistor would heat up by approximately 250° C. (ascertained from dR3 and TK, with 1.0/4000 ppm/° C.); in this temperature range, TK typically also changes by only very little, and so the linear assumption of equation 4 is still highly applicable.

The resistance value R(T0) can be selected in a suitable manner depending on the expected current to be measured. Low resistances result in less heating, but also a lower voltage drop, which has a tendency to increase noise in the measurement. Higher resistances result in a higher voltage drop, which is more easily differentiated from the noise, but also result in a greater heating-up of the resistors, which, if the heating-up is excessive, can finally result in non-linear behavior (which should be avoided). In general, higher resistance values should be used for smaller currents to be measured, and vice versa.

Within the scope of the disclosure, it is preferable when changes in the resistance value of the resistor elements in the shunt arrangement due to the resistance heating during the current measurement with respect to the resistance value at the reference temperature (typically room temperature, 20° C.) is a maximum of 200%, particularly preferably a maximum of 100%, very particularly preferably a maximum of 10%, and even further preferably a maximum of 5%. It is also preferable when the temperature of resistor elements in the shunt arrangement during the current measurement increases to a maximum of 400° C., particularly preferably a maximum of 300° C., very particularly preferably a maximum of 200° C., and even further preferably a maximum of 150° C. Preferably, the temperature coefficient TK of resistor elements of the shunt arrangement at the reference temperature (typically 20° C.) is between 40 ppm/° C. and 8000 ppm/° C., particularly preferably between 50 ppm/° C. and 5000 ppm/° C. Further preferably, the thermal transfer resistance Rth of the resistor elements on the base plate is between 0.5° C./watt and 1000° C./watt; also preferably, Rth is equal to or less than 10° C./watt, particularly preferably equal to or less than 5° C./watt, very particularly preferably equal to or less than 2° C./watt.

The applied resistance value R(T0) of the resistor elements of the shunt arrangement at the reference temperature T0 (typically T0=20° C.) can vary by a great extent within the scope of the disclosure depending on the measuring task, as is also the case for the currents Is to be measured. In many applications R(T0)≤100 ohm, usually also R(T0)≤1 ohm, and often also R(T0)≤0.1 ohm. Moreover, in many applications 0.01 mA≤Is≤2000 A, or also 0.1 mA≤Is≤1000 A, and often also 1 mA≤Is≤500 A.

Second Embodiment of a Measuring Arrangement

Figure 3:
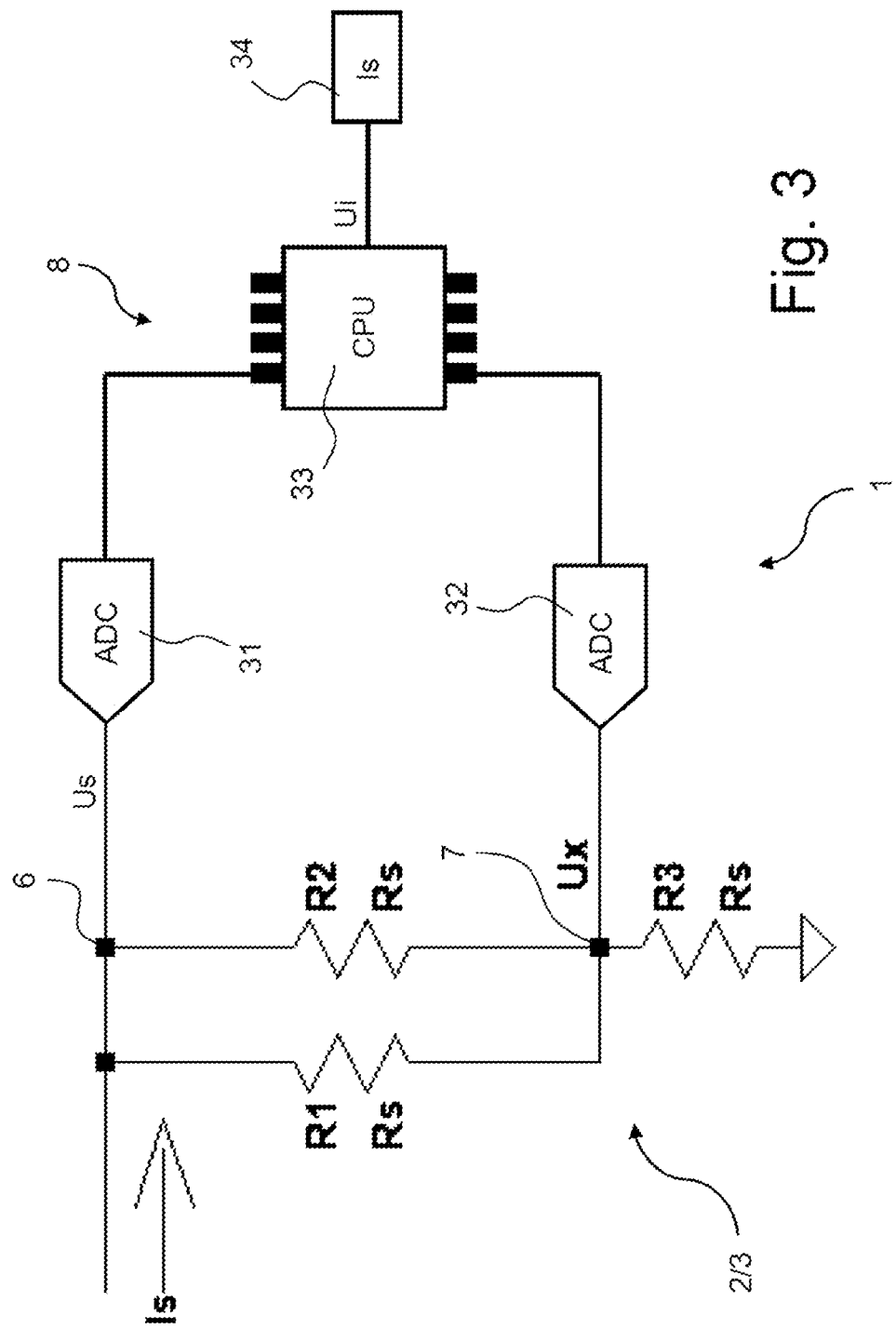
FIG. 3 shows a schematic representation of a second embodiment of a measuring arrangement for carrying out a method for determining an electric current, including two A/D converters and a microprocessor.

Moreover, FIG. 3 presents a second embodiment of a measuring arrangement for use in a method. The measuring arrangement 1 from FIG. 3 largely corresponds to the measuring arrangement from FIG. 1, and so only the essential differences are to be explained here.

The measuring arrangement 1 from this embodiment also includes a shunt arrangement 2, which is formed as a voltage divider circuit 3. One other evaluation unit 8 is provided here, however.

The first voltage Us at the voltage tap 6 is supplied to an analog to digital converter (also referred to in short as an A/D converter) 31. Moreover, the second voltage Ux at the voltage tap 7 is supplied to a further A/D converter 32. The signals of the two A/D converters ADC 31, 32 are supplied to a microprocessor 33. The microprocessor 33 calculates, on the basis thereof, a temperature-compensated voltage drop (equivalent voltage) Ui according to a stored formula, for example, according to the formula from equation 31 or equation 32. In the embodiment shown, the equivalent voltage Ui is transferred to a connection device 34, in which the electric current Is is calculated according to Is=Ui/R(T0) and is output (for example, displayed) and/or further processed (for example, in a control circuit). Alternatively, the equivalent voltage Ui can also be converted into the current Is already in the microprocessor 33, and the amperage Is is then transferred to the connection device 34 and is output and/or further processed by the connection device 34.

Figure 4:
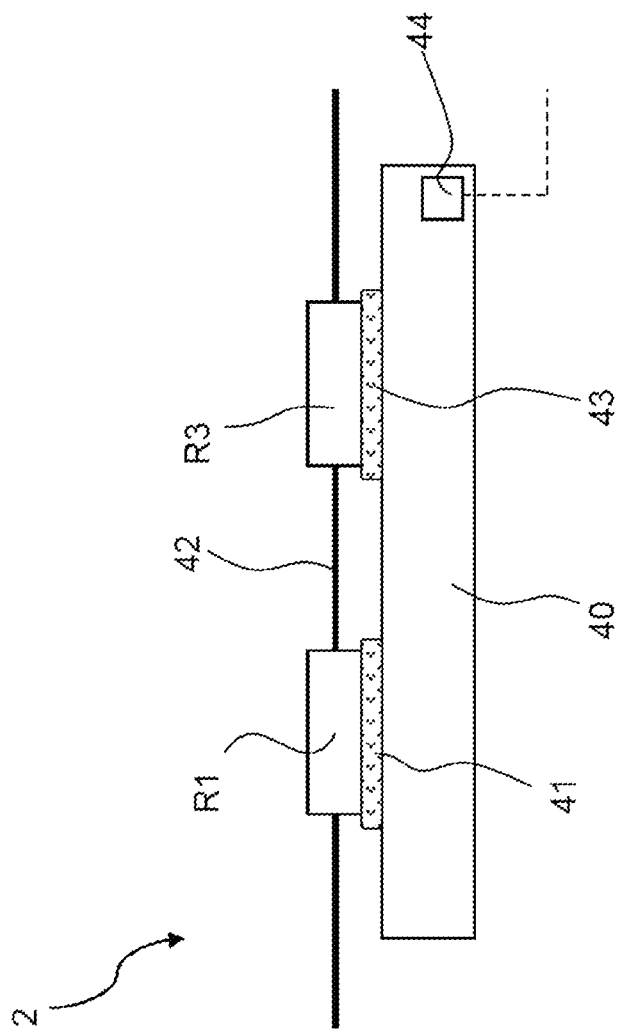
FIG. 4 shows a schematic sectional view of a shunt arrangement including multiple resistor elements on a common base plate.

FIG. 4 illustrates a shunt arrangement 2 in an exemplary, schematic sectional view. Multiple identical resistor elements R1, R3 are arranged on the shunt arrangement 2 and are thermally coupled to a common base plate 40 in an identical way. The resistor elements R1, R3 are of equal size, in particular geometrically. Defined thermal bridges 41, 43 are formed between the base plate 40 and the resistor elements R1, R3, the thermal bridges 41, 43 being of equal size (and of equal thickness in particular in the vertical direction and having the identical area in the horizontal plane) and formed from an identical material. The thermal bridges 41, 43 are in physical contact at the top side with the resistor elements R1, R3 and are in physical contact at the bottom side with the common base plate 40. The resistor elements R1, R3 (two of which are shown here by way of example) are electrically interconnected to each other via line connections 42, for example, metal wires.

A temperature sensor 44 is also arranged at the base plate 40 in this case, with which the temperature TP of the base plate 40 can be measured. If this temperature TP significantly deviates from the reference temperature T0, an additive correction of the voltage Ui determined from Ux and Us (see, for example, in FIG. 1 or FIG. 3, above) can be carried out according to Ui korrigiert=Ui+Ukorr=Ui+Is*dTP*TK*R(T0) via the temperature difference dTP between the base plate 40 (or its temperature TP) and the reference temperature T0.

In summary, a method is described for determining an electric current Is, which is passed through a shunt arrangement (2), wherein a heating in the shunt arrangement (2) generated by the electric current Is is at least partially compensated for, characterized in that the shunt arrangement (2) is formed from at least three identical resistor elements (R1, R2, R3), which, at identical temperatures (T1, T2, T3), have the same resistance value (R1, R2, R3) and which are thermally coupled in an identical way to a common base plate (40), the current Is is divided in such a way that a first local electric current I1 through a first resistor element (R1) is not equal to a second local electric current I3 through a second resistor element (R3), at least a first voltage (Us) and a second voltage (Ux) are measured at the shunt arrangement (2), by means of which the voltage (U1) dropping across the first resistor element (R1) and the voltage (U3) dropping across the second resistor element (R3) are determinable, and the electric current Is is determined by means of the measured first voltage (Us) and the measured second voltage (Ux). With the measuring method, an at least partial compensation of the heating of the shunt arrangement induced by the current can be carried out in a simple way.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS 1 measuring arrangement
2 shunt arrangement
3 voltage divider circuit
4 input of the shunt arrangement
5 output of the shunt arrangement
6 voltage tap for first voltage
7 voltage tap for second voltage
8 evaluation unit
9 analog computing circuit
10 input of the analog computing circuit for first voltage
11 input of the analog computing circuit for second voltage
12 high-resistance voltage divider
13 operation amplifier
14 operation amplifier voltage divider
15a center tap of the high-resistance voltage divider
15b center tap of the operation amplifier voltage divider
16 output of the operation amplifier
17 first/positive/non-inverting input of the operation amplifier
18 second/negative/inverting input of the operation amplifier
31, 32 A/D converter
33 microprocessor
34 connection device
40 common base plate
41 thermal bridge
42 line connection
43 thermal bridge
44 temperature sensor of the base plate
dT temperature difference with respect to the reference temperature
dT1 temperature difference of the first resistor element R1 with respect to the reference temperature
dT3 temperature difference of the second resistor element R3 with respect to the reference temperature
dTP temperature difference of the base plate with respect to the reference temperature
I current/amperage (in general)
Is electric current/amperage to be measured
I1 local current/amperage through the first resistor element R1
I3 local current/amperage through the second resistor element R3
KF correction factor
P power loss
R resistance value (in general)
Rth thermal transfer resistance
R1 first resistor element/resistance value of the first resistor element
R2 resistor element
R3 second resistor element/resistance value of the second resistor element
R10, R11 resistor elements/resistance values of the high-resistance voltage divider
R12, R13 resistor elements/resistance values of the operation amplifier voltage divider
S1 first circuit part
S2 second circuit part
T temperature (in general)
TK temperature coefficient
TP temperature of the base plate
T0 reference temperature
T1 temperature of the resistor element R1
T3 temperature of the resistor element R3
U1 voltage drop across the first resistor element R1
U3 voltage drop across the second resistor element R3
Ux second voltage/voltage at the voltage tap 7, corresponds to U3
Us first voltage/voltage at the voltage tap 6, corresponds to U1+U3
Ui temperature-compensated voltage drop/equivalent voltage

What is claimed is:

1. A method for determining an electric current (Is), the method comprising:
    sending the electric current (Is) to be measured through a shunt arrangement, the shunt arrangement comprising:
        at least three identical resistor elements, each respective identical resistor element having, at identical temperatures, a same resistance value, wherein the at least three identical resistor elements are thermally coupled in an identical way to a common base plate, wherein the at least three resistor elements are electrically interconnected such that the electric current (Is) is, when flowing through the shunt arrangement, at least partially divided such that a first local electric current (I1) through a first resistor element is not equal to a second local electric current (I3) through a second resistor element;
    measuring, at the shunt arrangement, at least a first voltage and a second voltage, via which the voltage dropping across a first respective resistor element and the voltage dropping across a second respective resistor element are directly or indirectly determinable; and
    determining the electric current (Is) via the first voltage and the second voltage,
    wherein a heating in the shunt arrangement generated by the electric current (Is) is at least partially taken into account in the determining the electric current (Is).

2. The method according to claim 1, wherein the determining the electric current (Is) via the first voltage and the second voltage, comprises assuming that an instantaneous temperature difference exists between a respective resistor element and a reference temperature, wherein the instantaneous temperature difference is proportional to an electric power instantaneously dropping at the respective resistor element.

3. The method according to claim 1, wherein the determining the electric current (Is) via the first voltage and the second voltage comprises assuming that the following applies for a ratio dT3/dT1 and a ratio I3/I1:

$$dT3/dT1=(I3/I1)^2,$$

wherein dT1 is an instantaneous temperature difference between the first resistor element and a reference temperature (T0), wherein dT3 is an instantaneous temperature difference between the second resistor element with respect to the reference temperature (T0).

4. The method according to claim 1, wherein the determining the electric current (Is) via the first voltage and the second voltage comprises assuming that the following applies for an instantaneously dropping power in a respective resistor element:

$$P(T0+dT)=R(T0+dT)*I^2,$$

wherein T0 is a reference temperature, R(T0+dT) is an instantaneous resistance value of the respective resistor element at the temperature T0+dT, dT is an instantaneous temperature difference between the respective resistor element and the reference temperature (T0), and I is an instantaneous current through the respective resistor element.

5. The method according to claim 1, wherein a temperature-compensated voltage drop (Ui) is at least approximately determined from the first voltage and the second voltage, the temperature-compensated voltage drop (Ui) corresponding to a voltage drop of the applied electric current (Is) to be measured across a respective resistor element at a reference temperature or a multiple thereof.

6. The method according to claim 5, wherein the determination of the temperature-compensated voltage drop (Ui) is carried out by an analog computing circuit, wherein the analog computing circuit has an input for the first voltage and an input for the second voltage.

7. The method according to claim 5, wherein the first voltage and the second voltage are both digitized using an analog-to-digital (A/D) converter, and wherein the temperature-compensated voltage drop (Ui) is at least approximately determined digitally by a microprocessor.

8. The method according to claim 5, wherein a temperature of the base plate is measured by a temperature sensor and a temperature difference (dTP) between the base plate and the reference temperature (T0) is determined, wherein that the temperature-compensated voltage drop (Ui) is additively corrected with a correction voltage Ukorr, wherein the correction voltage Ukorr is proportional to Is*dTP*TK*R(T0), and wherein TK is a temperature coefficient of the respective resistor elements at the reference temperature and R(T0) is a resistance value of the resistor element at the reference temperature.

9. The method according to claim 1, wherein the shunt arrangement is designed as a voltage divider circuit, including a first circuit part and a second circuit part, wherein the first circuit part and the second circuit part are connected in series.

10. The method according to claim 9, wherein:
the first circuit part includes N resistor elements connected in parallel to one another, with N≥2, and
the second circuit part includes one resistor element or M resistor elements connected in parallel to one another, with M≥1 and N>M.

11. The method according to claim 9, wherein the first circuit part includes precisely two resistor elements connected in parallel to one another, and the second circuit part includes precisely one resistor element.

12. The method according to claim 9, wherein:
a voltage drop (Us) across the entire shunt arrangement is measured as the first voltage and a voltage drop (Ux) across the second circuit part is measured as the second voltage,
a compensated voltage drop (Ui) is determined from Us and Ux, the compensated voltage drop (Ui) corresponding to the voltage drop of the electric current (Is) flowing across a respective resistor element at a reference temperature (T0), and
the electric current (Is) flowing through the shunt arrangement is determined according to Is=Ui/R(T0), where R(T0) is a resistance of the respective resistor element at the reference temperature (T0).

13. The method according to claim 12, wherein Ui is determined according to Ui=8*Us/3−3*Ux.

14. The method according to claim 12, wherein Ui is determined according to Ui=3*Ux*(Us−Ux)/(3*Ux−Us).

15. The method according to claim 12, wherein the determination of Ui is carried out by an analog computing circuit, the analog computing circuit comprising:
a high-resistance voltage divider, a voltage division factor of which corresponds to a voltage division factor of the voltage divider circuit, wherein an input of the analog computing circuit for Us is connected to the high-resistance voltage divider, wherein the high-resistance voltage divider comprises voltage divider resistors that have a resistance value greater than a resistance value of the resistor elements of the voltage divider circuit by at least $10^4$,
an operation amplifier voltage divider, wherein an input of the analog computing circuit for Ux is connected to the operation amplifier voltage divider, and
an operation amplifier, wherein a non-inverting, first operation amplifier input is connected to a center tap of the high-resistance voltage divider, and an inverting, second operation amplifier input is connected to a center tap of the operation amplifier voltage divider, and Ui is output at an output of the operation amplifier.

16. A method for determining an electric current (Is) in an NMR instrument, the method comprising:
sending the electric current (Is) to be measured through a shunt arrangement, the shunt arrangement comprising:
at least three identical resistor elements, each respective identical resistor element having, at identical temperatures, a same resistance value, wherein the at least three identical resistor elements are thermally coupled in an identical way to a common base plate, wherein the at least three resistor elements are electrically interconnected such that the electric current (Is) is, when flowing through the shunt arrangement, at least partially divided such that a first local electric current (I1) through a first resistor element is not equal to a second local electric current (I3) through a second resistor element;
measuring, at the shunt arrangement, at least a first voltage and a second voltage, via which the voltage dropping across a first respective resistor element and the voltage dropping across a second respective resistor element are directly or indirectly determinable; and determining the electric current (Is) via the first voltage and the second voltage, wherein a heating in the shunt arrangement generated by the electric current (Is) is at least partially taken into account in the determining the electric current (Is).

17. A measuring arrangement for determining an electric current (Is), comprising:
- a shunt arrangement comprising:
  - at least three identical resistor elements having, at identical temperatures, a same resistance value, the at least three identical resistor elements being thermally coupled, in an identical manner, to a common base plate, wherein the at least three resistor elements are electrically interconnected such that the electric current (Is) is, when flowing through the shunt arrangement, at least partially divided such that a first local electric current (I1) through a first resistor element is not equal to a second local electric current (I3) through a second resistor element;
- two voltage taps configured to directly or indirectly determine a first voltage dropping across the first resistor element and a second voltage dropping across the second resistor element, and
- an evaluator configured to determine the electric current (Is) is from the first voltage and the second voltage measured by the two voltage taps.

* * * * *